US012414273B2

(12) United States Patent
Bean, Jr.

(10) Patent No.: US 12,414,273 B2
(45) Date of Patent: Sep. 9, 2025

(54) IMMERSION COOLING RESERVOIR LEVEL CONTROL

(71) Applicant: Green Revolution Cooling, Inc., Austin, TX (US)

(72) Inventor: John H. Bean, Jr., Littlestown, PA (US)

(73) Assignee: Green Revolution Cooling, Inc., Austin, TX (US)

( * ) Notice: Subject to any disclaimer, the term of this patent is extended or adjusted under 35 U.S.C. 154(b) by 414 days.

(21) Appl. No.: 18/101,478

(22) Filed: Jan. 25, 2023

(65) Prior Publication Data

US 2024/0251531 A1 Jul. 25, 2024

(51) Int. Cl.
*H05K 7/20* (2006.01)

(52) U.S. Cl.
CPC ..... *H05K 7/20836* (2013.01); *H05K 7/20236* (2013.01); *H05K 7/20763* (2013.01)

(58) Field of Classification Search
CPC ........... H05K 7/20236; H05K 7/20763; H05K 7/20836
USPC ........................................................ 700/300
See application file for complete search history.

(56) References Cited

U.S. PATENT DOCUMENTS

| | | | |
|---|---|---|---|
| 1,093,951 A | 4/1914 | Steinberger | |
| 1,606,025 A | 11/1926 | Gruendler | |
| 2,440,930 A | 5/1948 | Guglielmo et al. | |
| 2,525,457 A | 10/1950 | Paluev | |
| 2,643,282 A | 6/1953 | Greene | |
| 3,094,133 A | 6/1963 | Treanor | |
| 3,320,762 A | 5/1967 | Murdoch | |
| 3,406,244 A | 10/1968 | Sevgin | |

(Continued)

FOREIGN PATENT DOCUMENTS

| | | |
|---|---|---|
| AU | 2009282170 B2 | 11/2014 |
| CN | 101443724 A | 5/2009 |

(Continued)

OTHER PUBLICATIONS

International Search Report and Written Opinion in PCT/US2024/035908, mailed Oct. 18, 2024, 9 pages.

(Continued)

*Primary Examiner* — Chun Cao
(74) *Attorney, Agent, or Firm* — Greenberg Traurig, LLP (57) ABSTRACT

Various embodiments include first and second coolant level regulator components of first and second component cooling tanks and a processor. Each of the first and second coolant level regulator components may include a temperature sensor configured to measure a temperature of the coolant in a reservoir, a coolant release valve configured to regulate the release of coolant from the reservoir, and a coolant level detector configured to detect a level of the coolant in the reservoir. The processor may receive temperature measurements from the temperature sensors, signal a target coolant level update for adjusting a level of the coolant in the reservoir by the coolant release valve. The target coolant level update may be determined based on a temperature average of the received temperature measurements from the temperature sensors. The coolant release valve may adjust a release of the coolant from the reservoir based on the target coolant level update.

16 Claims, 5 Drawing Sheets

(56) References Cited

U.S. PATENT DOCUMENTS

| | | |
|---|---|---|
| 3,450,265 A | 6/1969 | Kreusch et al. |
| 3,489,207 A | 1/1970 | Miller |
| 3,600,636 A | 8/1971 | Petersen |
| 3,754,741 A | 8/1973 | Whitehurst et al. |
| 3,858,090 A | 12/1974 | Lehmann |
| 4,034,335 A | 7/1977 | Harazoe et al. |
| 4,245,668 A | 1/1981 | Lindstrom |
| 4,302,793 A | 11/1981 | Rohner |
| 4,313,310 A | 2/1982 | Kobayashi et al. |
| 4,372,632 A | 2/1983 | Villa et al. |
| 4,399,501 A | 8/1983 | Masselin |
| 4,460,008 A | 7/1984 | O'Leary et al. |
| 4,464,315 A | 8/1984 | O'Leary |
| 4,493,010 A | 1/1985 | Morrison et al. |
| 4,590,538 A | 5/1986 | Cray, Jr. |
| 4,600,230 A | 7/1986 | Ise |
| 4,618,268 A * | 10/1986 | Horner .................. G01K 13/10 374/102 |
| 4,648,043 A | 3/1987 | O'Leary |
| 4,659,459 A | 4/1987 | O'Leary et al. |
| 4,704,658 A | 11/1987 | Yokouchi et al. |
| 4,722,577 A | 2/1988 | Mewborne |
| 4,741,385 A | 5/1988 | Bergles et al. |
| 4,834,257 A | 5/1989 | Book et al. |
| 5,102,503 A | 4/1992 | Silinski et al. |
| 5,145,585 A | 9/1992 | Coke |
| 5,260,850 A | 11/1993 | Sherwood et al. |
| 5,294,916 A | 3/1994 | Bolton et al. |
| 5,297,621 A | 3/1994 | Taraci et al. |
| 5,329,418 A | 7/1994 | Tanabe |
| 5,332,494 A | 7/1994 | Eden et al. |
| 5,414,591 A | 5/1995 | Kimura et al. |
| 5,574,627 A | 11/1996 | Porter |
| 5,655,459 A | 8/1997 | O'Connor et al. |
| 5,851,143 A | 12/1998 | Hamid |
| 5,907,473 A | 5/1999 | Przilas et al. |
| 6,019,167 A | 2/2000 | Bishop et al. |
| 6,374,627 B1 | 4/2002 | Schumacher et al. |
| D477,617 S | 7/2003 | Resch |
| 6,600,656 B1 | 7/2003 | Mori et al. |
| 6,616,851 B1 | 9/2003 | Sforza-Heinen et al. |
| 6,621,707 B2 | 9/2003 | Ishimine et al. |
| D483,045 S | 12/2003 | Resch |
| 6,909,606 B2 | 6/2005 | Barsun et al. |
| 7,086,247 B2 | 8/2006 | Campbell et al. |
| D530,346 S | 10/2006 | Resch |
| 7,184,269 B2 | 2/2007 | Campbell et al. |
| 7,210,304 B2 | 5/2007 | Nagashima et al. |
| 7,278,273 B1 | 10/2007 | Whitted et al. |
| 7,307,841 B2 | 12/2007 | Berlin et al. |
| 7,318,322 B2 | 1/2008 | Ota et al. |
| 7,403,392 B2 | 7/2008 | Attlesey et al. |
| 7,413,394 B2 | 8/2008 | Risser |
| 7,511,959 B2 | 3/2009 | Belady et al. |
| 7,511,960 B2 | 3/2009 | Hillis et al. |
| 7,551,971 B2 | 6/2009 | Hillis |
| 7,604,027 B2 | 10/2009 | Thatcher |
| 7,609,518 B2 | 10/2009 | Hopton et al. |
| 7,686,175 B2 | 3/2010 | Waisanen |
| 7,724,513 B2 | 5/2010 | Coglitore et al. |
| 7,724,517 B2 | 5/2010 | Attlesey et al. |
| 7,757,506 B2 | 7/2010 | Ellsworth, Jr. et al. |
| 7,843,298 B2 | 11/2010 | Hosokawa et al. |
| 7,854,652 B2 | 12/2010 | Yates et al. |
| 7,856,838 B2 | 12/2010 | Hillis et al. |
| 7,905,106 B2 | 3/2011 | Attlesey |
| 7,911,782 B2 | 3/2011 | Attlesey et al. |
| 7,911,793 B2 | 3/2011 | Attlesey |
| 7,934,386 B2 | 5/2011 | Rummel et al. |
| 7,961,463 B2 | 6/2011 | Belady et al. |
| 7,971,632 B2 | 7/2011 | Eriksen |
| 7,983,040 B2 | 7/2011 | Campbell et al. |
| 8,009,419 B2 | 8/2011 | Attlesey et al. |
| 8,047,904 B2 | 11/2011 | Yates et al. |
| 8,213,261 B2 | 7/2012 | Imhof et al. |
| 8,295,047 B1 | 10/2012 | Hamburgen et al. |
| 8,310,829 B2 | 11/2012 | Monk et al. |
| 8,654,529 B2 | 2/2014 | Attlesey |
| 8,817,465 B2 | 8/2014 | Campbell et al. |
| 8,964,391 B2 | 2/2015 | Campbell et al. |
| 9,042,098 B2 | 5/2015 | Campbell et al. |
| 9,049,800 B2 | 6/2015 | Shelnutt et al. |
| D744,996 S | 12/2015 | Keisling et al. |
| 9,269,544 B2 | 2/2016 | Koo et al. |
| 9,386,727 B2 | 7/2016 | Barringer et al. |
| 9,439,327 B1 | 9/2016 | Sheng et al. |
| 9,504,190 B2 | 11/2016 | Best |
| 9,664,180 B2 | 5/2017 | Saavedra |
| 9,699,938 B2 | 7/2017 | Shelnutt et al. |
| D796,654 S | 9/2017 | Baker et al. |
| 9,756,766 B2 | 9/2017 | Best |
| 9,801,465 B1 | 10/2017 | Finch, Jr. |
| 9,861,194 B1 | 1/2018 | Park |
| D821,326 S | 6/2018 | Kreiner |
| 9,992,914 B2 | 6/2018 | Best et al. |
| 10,123,463 B2 | 11/2018 | Best et al. |
| 10,212,849 B2 | 2/2019 | Matsumoto et al. |
| 10,306,804 B2 | 5/2019 | Chester et al. |
| D852,936 S | 7/2019 | Baker et al. |
| 10,342,164 B2 | 7/2019 | So et al. |
| 10,405,457 B2 | 9/2019 | Boyd et al. |
| D875,206 S | 2/2020 | Gourgel et al. |
| 10,667,427 B2 | 5/2020 | Gao |
| 10,743,438 B2 | 8/2020 | Wakino et al. |
| 10,820,446 B2 | 10/2020 | Boyd et al. |
| 10,939,581 B1 | 3/2021 | Chen et al. |
| 11,000,943 B2 | 5/2021 | Reynolds |
| 11,359,865 B2 | 6/2022 | Stone et al. |
| 11,369,041 B2 | 6/2022 | Yang et al. |
| 11,457,735 B1 | 10/2022 | D'Lsep |
| 11,516,943 B2 | 11/2022 | Bilan et al. |
| 2002/0014460 A1 | 2/2002 | McKay |
| 2002/0080575 A1 | 6/2002 | Nam et al. |
| 2002/0151799 A1 | 10/2002 | Pantages et al. |
| 2002/0185262 A1 | 12/2002 | Baer |
| 2002/0189173 A1 | 12/2002 | Staschik |
| 2003/0053293 A1 | 3/2003 | Beitelmal et al. |
| 2003/0127240 A1 | 7/2003 | Beckbissinger et al. |
| 2004/0008490 A1 | 1/2004 | Cheon |
| 2004/0013563 A1 | 1/2004 | Romer et al. |
| 2004/0050491 A1 | 3/2004 | Miya et al. |
| 2004/0223300 A1 | 11/2004 | Fink et al. |
| 2004/0246683 A1 | 12/2004 | Honsberg-Riedl et al. |
| 2004/0254682 A1 | 12/2004 | Kast |
| 2005/0011839 A1 | 1/2005 | Dart et al. |
| 2005/0024826 A1 | 2/2005 | Bash et al. |
| 2005/0052847 A1 | 3/2005 | Hamman |
| 2005/0083657 A1 | 4/2005 | Hamman |
| 2005/0111184 A1 | 5/2005 | Cliff et al. |
| 2005/0114876 A1 | 5/2005 | Atarashi et al. |
| 2005/0152112 A1 | 7/2005 | Holmes et al. |
| 2005/0259402 A1 | 11/2005 | Yasui et al. |
| 2006/0026610 A1 | 2/2006 | Sasao et al. |
| 2006/0064709 A1 | 3/2006 | Throckmorton et al. |
| 2006/0123436 A1 | 6/2006 | Tanaka et al. |
| 2006/0135042 A1 | 6/2006 | Frost et al. |
| 2006/0250755 A1 | 11/2006 | Tilton et al. |
| 2006/0274501 A1 | 12/2006 | Miller |
| 2007/0006599 A1 | 1/2007 | Kawamura et al. |
| 2007/0025081 A1 | 2/2007 | Berlin et al. |
| 2007/0029011 A1 | 2/2007 | Thatcher |
| 2007/0034360 A1 | 2/2007 | Hall |
| 2007/0199340 A1 | 8/2007 | Knight et al. |
| 2007/0213000 A1 | 9/2007 | Day |
| 2007/0227710 A1 | 10/2007 | Belady et al. |
| 2007/0267741 A1 | 11/2007 | Attlesey et al. |
| 2008/0002364 A1 | 1/2008 | Campbell et al. |
| 2008/0017355 A1 | 1/2008 | Attlesey et al. |
| 2008/0026509 A1 | 1/2008 | Campbell et al. |
| 2008/0029250 A1 | 2/2008 | Carlson et al. |
| 2008/0030945 A1 | 2/2008 | Mojaver et al. |
| 2008/0055845 A1 | 3/2008 | Murakami et al. |
| 2008/0158818 A1 | 7/2008 | Clidaras et al. |
| 2008/0174954 A1 | 7/2008 | Vangilder et al. |

(56) References Cited

U.S. PATENT DOCUMENTS

| | | |
|---|---|---|
| 2008/0180908 A1 | 7/2008 | Wexler |
| 2008/0196868 A1 | 8/2008 | Attlesey et al. |
| 2008/0196870 A1 | 8/2008 | Attlesey et al. |
| 2008/0209931 A1 | 9/2008 | Stevens |
| 2008/0266726 A1 | 10/2008 | Murakami et al. |
| 2008/0270572 A1 | 10/2008 | Belady et al. |
| 2008/0273306 A1 | 11/2008 | Campbell et al. |
| 2009/0168345 A1 | 7/2009 | Martini |
| 2009/0219681 A1 | 9/2009 | Goth et al. |
| 2009/0229194 A1 | 9/2009 | Armillas |
| 2009/0251860 A1 | 10/2009 | Belady et al. |
| 2009/0260777 A1 | 10/2009 | Attlesey |
| 2009/0262455 A1 | 10/2009 | Merrow |
| 2009/0295167 A1 | 12/2009 | Clidaras et al. |
| 2010/0027212 A1 | 2/2010 | Daunert Armillas |
| 2010/0030267 A1 | 2/2010 | Winslow et al. |
| 2010/0033070 A1 | 2/2010 | Cheng |
| 2010/0061057 A1 | 3/2010 | Dersch et al. |
| 2010/0103618 A1 | 4/2010 | Campbell et al. |
| 2010/0139887 A1 | 6/2010 | Slessman |
| 2010/0165565 A1 | 7/2010 | Hellriegal et al. |
| 2010/0226094 A1 | 9/2010 | Attlesey et al. |
| 2010/0246118 A1 | 9/2010 | Attlesey |
| 2010/0263885 A1 | 10/2010 | Tuma |
| 2010/0275441 A1 | 11/2010 | Rasmussen et al. |
| 2010/0290190 A1 | 11/2010 | Chester et al. |
| 2010/0302678 A1 | 12/2010 | Merrow |
| 2010/0328889 A1 | 12/2010 | Campbell et al. |
| 2011/0075353 A1 | 3/2011 | Attlesey et al. |
| 2011/0103019 A1 | 5/2011 | Campbell et al. |
| 2011/0120885 A1 | 5/2011 | Miller et al. |
| 2011/0132579 A1* | 6/2011 | Best .................. H05K 7/20327 165/104.31 |
| 2011/0134604 A1 | 6/2011 | Attlesey |
| 2011/0151765 A1 | 6/2011 | Chen et al. |
| 2011/0157829 A1 | 6/2011 | Wormsbecher et al. |
| 2011/0183051 A1 | 7/2011 | Skender |
| 2011/0240281 A1 | 10/2011 | Avery |
| 2011/0267775 A1 | 11/2011 | Vanderveen et al. |
| 2012/0026691 A1 | 2/2012 | Campbell et al. |
| 2012/0035773 A1 | 2/2012 | Stabinski et al. |
| 2012/0123595 A1 | 5/2012 | Bower, III et al. |
| 2012/0155027 A1 | 6/2012 | Broome et al. |
| 2012/0171943 A1 | 7/2012 | Dunnavant |
| 2012/0236487 A1 | 9/2012 | Wallace et al. |
| 2012/0294737 A1 | 11/2012 | Singh et al. |
| 2012/0300391 A1 | 11/2012 | Keisling et al. |
| 2013/0021746 A1 | 1/2013 | Campbell et al. |
| 2013/0025888 A1 | 1/2013 | Eckholm et al. |
| 2013/0032217 A1 | 2/2013 | Pesek et al. |
| 2013/0075066 A1 | 3/2013 | Reytblat |
| 2013/0091814 A1 | 4/2013 | Smith |
| 2013/0105120 A1 | 5/2013 | Campbell et al. |
| 2013/0105139 A1 | 5/2013 | Campbell et al. |
| 2013/0146273 A1 | 6/2013 | Chester et al. |
| 2014/0060773 A1 | 3/2014 | Wajima |
| 2014/0060799 A1 | 3/2014 | Eckberg et al. |
| 2014/0085817 A1 | 3/2014 | Campbell et al. |
| 2014/0085821 A1 | 3/2014 | Regimbal et al. |
| 2014/0109610 A1 | 4/2014 | Wulf et al. |
| 2014/0124167 A1 | 5/2014 | Campbell et al. |
| 2014/0211412 A1 | 7/2014 | Best |
| 2014/0216686 A1 | 8/2014 | Shelnutt et al. |
| 2014/0216688 A1 | 8/2014 | Shelnutt et al. |
| 2014/0218858 A1 | 8/2014 | Shelnutt et al. |
| 2014/0301037 A1 | 10/2014 | Best |
| 2014/0307384 A1 | 10/2014 | Best |
| 2014/0362527 A1 | 12/2014 | Best |
| 2015/0048950 A1 | 2/2015 | Zeighami et al. |
| 2015/0062806 A1 | 3/2015 | Shelnutt et al. |
| 2015/0138723 A1 | 5/2015 | Shedd et al. |
| 2015/0181762 A1 | 6/2015 | Boyd et al. |
| 2015/0195953 A1 | 7/2015 | Best et al. |
| 2015/0245539 A1 | 8/2015 | Pelletier et al. |
| 2015/0276292 A1 | 10/2015 | Son et al. |
| 2015/0305209 A1 | 10/2015 | Inaba et al. |
| 2015/0334880 A1 | 11/2015 | Best |
| 2015/0359145 A1 | 12/2015 | Zhang et al. |
| 2016/0234970 A1 | 8/2016 | Shelnutt et al. |
| 2017/0142868 A1 | 5/2017 | Chen et al. |
| 2017/0265328 A1 | 9/2017 | Sasaki et al. |
| 2017/0265358 P1 | 9/2017 | Trees |
| 2017/0303434 A1 | 10/2017 | Katsumata et al. |
| 2017/0303443 A1 | 10/2017 | Inano et al. |
| 2017/0332514 A1 | 11/2017 | Saito |
| 2017/0359918 A1 | 12/2017 | Klaba et al. |
| 2018/0020571 A1 | 1/2018 | Saito |
| 2018/0020572 A1 | 1/2018 | Fujiwara et al. |
| 2018/0288906 A1 | 10/2018 | Hopton et al. |
| 2018/0368281 A1 | 12/2018 | Wang et al. |
| 2019/0090383 A1 | 3/2019 | Tufty et al. |
| 2019/0200482 A1 | 6/2019 | Boyd et al. |
| 2019/0329973 A1 | 10/2019 | Chabot |
| 2019/0344424 A1 | 11/2019 | Reynolds |
| 2019/0387641 A1 | 12/2019 | Aoki et al. |
| 2020/0093038 A1 | 3/2020 | Enright et al. |
| 2020/0323108 A1 | 10/2020 | Bilan et al. |
| 2021/0105910 A1 | 4/2021 | McCarthy |
| 2021/0290430 A1* | 9/2021 | Kim .................. A61M 35/003 |
| 2021/0368656 A1 | 11/2021 | Heydari |
| 2021/0382533 A1 | 12/2021 | Heydari |
| 2021/0400834 A1 | 12/2021 | Shen et al. |
| 2022/0220976 A1 | 7/2022 | Perevozchikov et al. |
| 2022/0248564 A1 | 8/2022 | Moon |
| 2023/0052701 A1 | 2/2023 | Chen et al. |
| 2023/0091814 A1 | 3/2023 | Gordon et al. |
| 2023/0164953 A1 | 5/2023 | Gregory et al. |
| 2023/0209781 A1* | 6/2023 | Gao .................. H05K 7/20272 700/281 |
| 2023/0269900 A1 | 8/2023 | Kelly et al. |
| 2023/0389231 A1* | 11/2023 | Chen .................. H05K 7/203 |

FOREIGN PATENT DOCUMENTS

| | | |
|---|---|---|
| CN | 109769381 A | 5/2019 |
| CN | 109874275 A | 6/2019 |
| CN | 111240448 A | 6/2020 |
| CN | 113795118 A | 12/2021 |
| CN | 114138084 A | 3/2022 |
| CN | 115407848 A | 11/2022 |
| GB | 82014500002000 | 5/2022 |
| JP | 2004319628 A | 11/2004 |
| JP | 2004363308 A | 12/2004 |
| JP | 2005015171 A | 1/2005 |
| JP | 2011518395 A | 6/2011 |
| JP | 2018019038 A | 2/2018 |
| JP | 2019161201 A | 9/2019 |
| JP | 2021519978 A | 8/2021 |
| KR | 20150018884 A | 2/2015 |
| WO | 2007023130 A2 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |
| WO | 2013022805 A1 | 2/2013 |
| WO | 2019061721 A1 | 4/2019 |
| WO | 2020234600 A1 | 11/2020 |

OTHER PUBLICATIONS

International Preliminary Report on Patentability and Written Opinion, Application No. PCT/US2023/016342, mailed Oct. 10, 2024 (5 Pages).

U.S. Appl. No. 18/244,844; Non-Final Office Action issued Nov. 6, 2024; 65 pages.

European Patent Office, "Partial Supplementary European Search Report," issued in related European Patent Application No. 21892814. 1, mailed Aug. 30, 2024 (15 pages).

Non-Final Office Action in U.S. Appl. No. 17/900,541, mailed Jun. 17, 2024, 8 pages.

(56) References Cited

OTHER PUBLICATIONS

International Search Report and Written Opinion for International Application No. PCT/US2023/026959, mailed Oct. 23, 2023, 8 pages.
Office Action for Chinese Application No. 200980131707.3, mailed Apr. 3, 2013, 3 pages.
Office Action for Chinese Application No. 200980131707.3, mailed Dec. 13, 2013, 4 pages.
International Search Report and Written Opinion in PCT/US2023/032438, mailed Dec. 27, 2023, 9 pages.
International Preliminary Report on Patentability in corresponding Application No. PCT/US2022/043817, mailed Mar. 28, 2024 (6 pages).
International Search Report and Written Opinion in corresponding Application No. PCT/US2024/010084, mailed May 1, 2024 (11 pages).
Office Action from U.S. Appl. No. 17/523,403, dated Apr. 23, 2024, 26 pages.
Applicant-Initiated Interview Summary from U.S. Appl. No. 13/057,881, dated Feb. 25, 2014, 4 pages.
Applicant-Initiated Interview Summary from U.S. Appl. No. 13/057,881, dated Jul. 1, 2014, 3 pages.
Applicant-Initiated Interview Summary from U.S. Appl. No. 13/057,881, dated Oct. 9, 2014, 3 pages.
Bakker A., "Modeling Flow Fields in Stirred Tanks," Reacting Flows—Lecture 7, 2006, 40 pages.
Communication pursuant to Article 94(3) EPC for European Patent Application No. 09807136.8, dated Nov. 26, 2018, 13 pages.
"Disruptive Technologies," SC|09, Disruptive Technologies Presentations, Retrieved from http://sc09.supercomputing.org/index-pg=disrupttech.html, Nov. 14-20, 2009, 2 pages.
"Disruptive Technologies," SC10 Disruptive Technologies, Retrieved from http://sc10.supercomputing.org/index-pg=disrupttech.html, Nov. 13-19, 2010, 8 pages.
Extended European Search Report for European Application No. 09807136.8, mailed Jun. 6, 2017, 12 Pages.
Extended European Search Report for European Application No. 12821634.8, mailed Jul. 15, 2015, 6 pages.
Final Office Action from U.S. Appl. No. 13/057,881, dated Jun. 16, 2015, 30 pages.
Final Office Action from U.S. Appl. No. 13/057,881, dated Nov. 22, 2013, 13 pages.
Final Office Action from U.S. Appl. No. 13/057,881, dated Nov. 3, 2014, 23 pages.
"GRC ICE Immersion Cooling Solutions Brochure," Retrieved from https://www.grcooling.com/wp-content/uploads/2018/06/GRC_ICE_Product_Brochure.pdf, Jun. 2018, 4 pages.
"GRC ICEraQ® Series 10 Launch Event Presentation," Retrieved from https://digitalinfranetwork.com/videos/655447036-2/, Dec. 27, 2021, 1 page.
"GRC® Releases the Next Generation of Data Center Liquid Immersion Cooling, Providing Increased Sustainability Capable of Delivering a PUE Yield of 1.03 and a Significant Reduction in Operating Costs," Retrieved https://www.businesswire.com/news/home/20210518005857/en/GRC%C2%AE-Releases-the-Next-Generation-of-Data-Center-Liquid-Immersion-Cooling-Providing-Increased-Sustainability-Capable-of-Delivering-a-PUE-Yield-of-1.03-and-a-Significant-Reduction-in-Operating-Costs, May 18, 2021, 3 pages.
"Green Revolution Cooling Named a Disruptive Technology of the Year at SC'10," Press Release, Nov. 1, 2010, 1 page.
"Green Revolution Cooling Named Disruptive at SC'09," Press Release, Aug. 3, 2009, 1 page.
Hernandez P., "Are Liquid-Cooled Servers Coming to a Data Center Near You?," CleanTech, Dec. 4, 2009, 2 pages.
Hernandez P., "Will IT Managers Warm to Liquid-Cooled Servers?," Green Revolution Cooling, Dec. 8, 2009, 3 pages.
"ICEraQ 10 Quad Duo-Specification Sheet," Retrieved from https://www.grcooling.com/wp-content/uploads/2018/06/GRC_Data_Sheet_ICEraQ_Quad-Duo-One.pdf, 2021, 2 pages.
Intel, "Intel® Core™ 2 Duo Processor on 65 nm Process for Embedded Applications," Thermal Design Guide, Aug. 2007, pp. 1, 14, and 21.
Intel, "Intel® Pentium® 4 Processor on 90 nm Process," Datasheet, Feb. 2005, pp. 64-65.
"Intel Xeon Processor E7-4800/8800 v3 Product Families", May 2015, p. 46 (1 page).
International Preliminary Report on Patentability, Application No. PCT/US2014/033081, mailed Oct. 15, 2015, 7 pages.
International Preliminary Report on Patentability, Application No. PCT/US2014/037005, mailed Nov. 19, 2015, 12 pages.
International Preliminary Report on Patentability for International Application No. PCT/US2009/053305, mailed Feb. 24, 2011, 19 pages.
International Preliminary Report on Patentability for International Application No. PCT/US2015/030618, mailed Nov. 24, 2016, 10 pages.
International Search Report and Written Opinion for International Application No. PCT/US2009/053305, mailed Oct. 14, 2009, 17 pages.
International Search Report and Written Opinion for International Application No. PCT/US20115/030618, mailed Aug. 5, 2015, 12 pages.
International Search Report and Written Opinion for International Application No. PCT/US2012/049668, mailed Oct. 19, 2012, 10 pages.
International Search Report and Written Opinion for International Application No. PCT/US2014/017835, mailed Jun. 13, 2014, 9 pages.
International Search Report and Written Opinion for International Application No. PCT/US2014/033081, mailed Aug. 27, 2014, 9 pages.
International Search Report and Written Opinion for International Application No. PCT/US2014/033834, mailed Sep. 15, 2014, 16 pages.
International Search Report and Written Opinion for International Application No. PCT/US2014/037005, mailed Sep. 24, 2014, 18 pages.
International Search Report and Written Opinion for International Application No. PCT/US2015/43468, mailed Oct. 30, 2015, 11 pages.
International Search Report and Written Opinion for International Application No. PCT/US2021/058991, dated Mar. 3, 2022, 10 pages.
International Search Report and Written Opinion for International Application No. PCT/US2022/043817, mailed Jan. 10, 2023, 10 pages.
Lee S.Y., "Hydraulics and Mixing Evaluations for NT-21/41 Tanks," Revision 0, Oct. 2014, 32 pages.
Markoff J., "Data Centers' Power Use Less Than Was Expected," The New York Times, Jul. 31, 2011, 3 pages.
Miller R, "Data Center Used to Heat Swimming Pool," Data Center Knowledge, Retrieved from https://www.datacenterknowledge.com/archives/2008/04/02/data-center-used-to-heat-swimming-pool, Apr. 2, 2008, 2 pages.
Non-Final Office Action in U.S. Appl. No. 14/667,091, mailed May 22, 2015, 30 pages.
Non-final Office Action, U.S. Appl. No. 14/237,100, mailed Sep. 30, 2015, 21 pages.
Non-final Office Action, U.S. Appl. No. 14/245,978, mailed Jan. 13, 2016, 11 pages.
Non-final Office Action, U.S. Appl. No. 14/251,014, mailed Dec. 4, 2015, 13 pages.
Non-final Office Action, U.S. Appl. No. 14/271,386, mailed Dec. 17, 2015, 17 pages.
Notice of Acceptance for Australian Application No. 2009282170, mailed Nov. 14, 2014, 2 pages.
Office Action and Search Report for Chinese Application No. 200980131707.3, mailed Dec. 20, 2012, 17 pages.
Office Action for Canadian Application No. 2731994, mailed Dec. 3, 2015, 6 pages.
Office Action for Canadian Application No. 2731994, mailed Nov. 8, 2016, 4 pages.

(56) References Cited

OTHER PUBLICATIONS

Office Action for Chinese Application No. 200980131707.3, mailed Apr. 18, 2014, 7 pages.
International Search Report and Written Opinion for International Application No. PCT/US2023/016342, mailed Jul. 13, 2023, 8 pages.
Office Action for Chinese Application No. 200980131707.3, mailed Dec. 31, 2014, 10 pages.
Office Action for Chinese Application No. 200980131707.3, mailed Jul. 31, 2013, 8 pages.
Office Action for Chinese Application No. 201280049039.1, mailed Oct. 27, 2015, 33 pages.
Office Action from U.S. Appl. No. 13/057,881, dated Apr. 11, 2014, 16 pages.
Office Action from U.S. Appl. No. 13/057,881, dated Jan. 9, 2015, 3 pages.
Office Action from U.S. Appl. No. 13/057,881, dated Jun. 4, 2013, 13 pages.
Office Action from U.S. Appl. No. 13/057,881, dated Mar. 3, 2015, 20 pages.
Park J, "New Cooling Strategies for Greater Data Center Energy Efficiency," Facebook, Nov. 4, 2010, 4 pages.
Patent Examination Report No. 2 for Australian Application No. 2009282170, mailed Jun. 18, 2014, 4 pages.
Patent Examination Report No. 2 for Australian Application No. 2009282170, mailed Nov. 15, 2013, 4 pages.
Substantive Examination Adverse Report for Malaysian Application No. PI2011000494, mailed May 15, 2015, 3 pages.
Supplementary Examination Report for Singapore Application No. 11202000306X, mailed Nov. 18, 2022, 4 pages.
"The Green500 List—Nov. 2013," The Green 500, Nov. 20, 2013, 3 pages.
U.S. Appl. No. 13/057,881, filed Feb. 7, 2011, Christiaan Scott Best, 72 pages.
U.S. Appl. No. 14/338,013, filed Jul. 22, 2014, Christiaan Scott Best, 60 pages.
U.S. Appl. No. 14/338,020, filed Jul. 22, 2014, Christiaan Scott Best, 60 pages.
U.S. Appl. No. 14/338,026, filed Jul. 22, 2014, Christiaan Scott Best, 60 pages.
U.S. Appl. No. 14/338,035, filed Jul. 22, 2014, Christiaan Scott Best, 60 pages.
U.S. Appl. No. 14/667,091, filed Mar. 24, 2015, Christiaan Scott Best, 65 pages.
Written Opinion and Search Report for Singapore Application No. 201100595-6, mailed Apr. 16, 2012, 20 pages.
Written Opinion and Search Report for Singapore Application No. 201100595-6, mailed May 2, 2012, 21 pages.

\* cited by examiner

IMMERSION COOLING RESERVOIR LEVEL CONTROL

BACKGROUND

Immersion cooling systems may be used to cool power distribution components of computer systems, such as commercial computer servers, by submerging those components in a tank filled with a dielectric coolant (sometimes referred to simply as a fluid). Often, such immersion cooling systems may be used with multiple off-the-shelf smaller racks and use tanks that may require separate cooling systems for each rack.

Although a single pump and heat exchanger may be used to cool multiple racks (i.e., a shared coolant distribution system), problems may arise in instances in which the multiple racks are desired to be cooled at different rates. In instances in which minor differences in coolant flow are used to vary the cooling rates of the racks, a difference in coolant levels in the various racks may be introduced. The difference in coolant levels may be a risk to the racks located in other tanks in instances in which the coolant levels raise too high or the coolant levels fall too low. In instances in which the coolant level is too high, there may be a risk that the coolant level may overflow the tank containing the rack. In instances in which the coolant level is too low, there may be the risk of exposing parts or all of the computer system to air, which can cause overheating due to insufficient coolant and cooling. In addition, in instances in which coolant levels fall to too low, there may be the risk of introducing air into the coolant circuit, which may damage pumps that circulate the coolant. While the coolant may be pumped out of the bottom of the tanks to avoid air intake, a subsequent leak or failure at a valve and/or duct located near the bottom of the tank may result in a complete draining of the tank. This in turn may again run the risk of exposing parts or all of the computer system to air, which can cause overheating due to insufficient coolant and cooling.

SUMMARY

Various aspects of the present disclosure include methods, systems, and devices for controlling coolant levels in a plurality of component cooling tanks sharing a unified coolant distribution system. Various aspects may include first coolant level regulator components of a first component cooling tank, second coolant level regulator components of a second component cooling tank, and a processor. The first coolant level regulator components of the first component cooling tank may include a first temperature sensor configured to measure a temperature of the coolant in a first reservoir, a first coolant release valve configured to regulate the release of coolant from the first reservoir, and a first coolant level detector configured to detect a level of the coolant in the first reservoir. The second coolant level regulator components of the second component cooling tank may include a second temperature sensor configured to measure a temperature of the coolant in a second reservoir, a second coolant release valve configured to regulate the release of coolant from the second reservoir, and a second coolant level detector configured to detect a level of the coolant in the second reservoir. The processor may be configured to receive the temperature measurements from the first temperature sensor and the second temperature sensor. The processor may also be configured to signal at least one target coolant level update for adjusting a level of the coolant in the first reservoir by the first coolant release valve. The at least one target coolant level update may be determined based on a temperature average of the received temperature measurements from the first temperature sensor and the second temperature sensor. The first coolant release valve may be configured to adjust a release of the coolant from the first reservoir in response to comparing the detected level of the coolant in the first reservoir to a target coolant level indicated by the at least one target coolant level update.

The first coolant level detector may include an ultrasonic fluid level sensor. The first coolant level regulator components may include a first coolant level controller configured to receive the signaled at least one target coolant level update. The first coolant level controller may be configured to activate the first coolant release valve in response to receiving the at least one target coolant level update. The first coolant level controller may be configured to operate independent of the processor configured to receive the temperature measurements from the first temperature sensor and the second temperature sensor. The signaled at least one target coolant level update from the processor may be configured to directly control at least the first coolant release valve for regulating the release of coolant associated therewith. The signaled at least one target coolant level update from the processor may be determined by converting the temperature average of the received temperature measurements to a density average of the coolant in the first reservoir and the second reservoir.

In some embodiments, the first coolant release valve may include a linear actuator configured to control a state of a coolant gate regulating the release of coolant. In some embodiments, the first coolant release valve may include a rotary actuator configured to control a state of a coolant gate regulating the release of coolant.

In some embodiments, the processor may be further configured to signal the at least one target coolant level update for adjusting a level of the coolant in at least one of the second reservoir by at least the second coolant release valve, wherein the at least one target coolant level update is determined based on the temperature average of the received temperature measurements from the first temperature sensor and the second temperature sensor.

In some embodiments, the system may further include third coolant level regulator components of a third component cooling tank and fourth coolant level regulator components of a fourth component cooling tank. The third coolant level regulator components of the third component cooling tank may include a third temperature sensor configured to measure a temperature of the coolant in a third reservoir, a third coolant release valve configured to regulate the release of coolant from the third reservoir, and a third coolant level detector configured to detect a level of the coolant in the third reservoir. The fourth coolant level regulator components of a fourth component cooling tank may include a fourth temperature sensor configured to measure a temperature of the coolant in a fourth reservoir, a fourth coolant release valve configured to regulate the release of coolant from the fourth reservoir, and a fourth coolant level detector configured to detect a level of the coolant in the fourth reservoir. The processor may be configured to receive the temperature measurements from the third temperature sensor and the fourth temperature sensor. The at least one target coolant level update signaled by the processor may be configured to adjust a level of the coolant in at least one of the third reservoir or the fourth reservoir by the third coolant release valve or the fourth coolant release valve, respectively.

In some embodiments, the first reservoir and the second reservoir may be configured to hold an overflow of the coolant from the first component cooling tank and the second component cooling tank, respectively. The first reservoir and the second reservoir may each be the largest coolant reservoirs of the first component cooling tank and the second component cooling tank, respectively.

Various embodiments include a method for controlling coolant levels in two or more component cooling tanks sharing a unified coolant distribution system. The method includes receiving, at a processor of the unified coolant distribution system, temperature measurements of a coolant in a first reservoir and a second reservoir of the two or more component cooling tanks. Also, the method includes receiving, at the processor of the unified coolant distribution system, a coolant level measurement of the coolant in the first reservoir. Additionally, the method includes signaling, by the processor to a coolant level regulator component of each of the two or more component cooling tanks, a target coolant level update configured to equalize levels of the coolant in the first reservoir and the second reservoir to a target coolant level, wherein the target coolant level is determined based on the received coolant level measurement and a temperature average of the received temperature measurements of the coolant in the first reservoir and the second reservoir.

In some embodiments, the target coolant level update signaled by the processor may be determined by converting the temperature average of the received temperature measurements to a density average of the coolant in the first reservoir and the second reservoir.

Signaling the target coolant level update may include signaling a first coolant level controller configured to control a first coolant release valve that regulates the release of coolant from the first reservoir and a second coolant level controller configured to control a second coolant release valve that regulates the release of coolant from the first reservoir.

Signaling the target coolant level update may include directly activating at least one of a first coolant release valve that regulates the release of coolant from the first reservoir or a second coolant release valve that regulates the release of coolant from the first reservoir.

BRIEF DESCRIPTION OF THE DRAWINGS

The accompanying drawings, which are incorporated herein and constitute part of this specification, illustrate exemplary embodiments of the claims and together with the general description given above and the detailed description given below, serve to explain the features of the claims.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments will be described in detail with reference to the accompanying drawings. Wherever possible, the same reference numbers will be used throughout the drawings to refer to the same or like parts. References made to particular examples and implementations are for illustrative purposes and are not intended to limit the scope of the claims.

In various embodiments, adjustments to the coolant level in each of a plurality of coolant tanks that share a volume of circulated coolant may be made to one, some or all of the plurality of the coolant tanks based on an average temperature of the coolant across the plurality of coolant tanks. The measure of the average temperature may be used to determine a current volume of the bulk fluid of the shared volume of circulated coolant across the plurality of coolant tanks. The measure of the average temperature may in turn be used to adjust an amount of coolant (i.e., volume of coolant) maintained in the coolant tanks or at least overflow, buffer, and/or outflow reservoirs thereof. To control coolant levels across the plurality of component cooling tanks, various embodiments may adjust coolant levels in each of the plurality of coolant tanks themselves and/or the reservoirs thereof. Thus, while various embodiments herein are described as adjusting the volume of the "reservoirs," it should be understood that the coolant level regulator components described herein may be used in the reservoirs and/or directly in the main reservoirs of each of the plurality of coolant tanks that hold the components being cooled. In this way, as used herein the term "reservoir" may refer to either main component cooling tank reservoirs, outflow reservoirs, buffer reservoirs, and/or overflow reservoirs.

The manifolds that allow coolant into multiple reservoirs typically provide uneven coolant flow into the different reservoirs. Even if the reservoir inlets were equipped with reservoir inlet control valves, which they are not typically equipped with, the inflow going to different reservoirs may vary. Also, while adjustable valves may be added to each of the inlet ports feeding coolant into the separate reservoirs, often space is more limited in or around the manifold. Thus, various embodiments add dynamically regulated valves at an exit port (i.e., an outlet) for the coolant in each reservoir. Without separately regulating the outlet ports of the manifold or inlet ports of the reservoirs, various embodiments dynamically regulate the outlet ports of the reservoirs.

In accordance with various embodiments, the height of the volume of coolant maintained in each of the plurality of reservoirs may be adjusted based on the measured average temperature. These adjustments may encourage an equal height of coolant (i.e., fluid) across the plurality of reservoirs. The system may attempt to keep all the reservoirs at the same coolant level in order to maintain an even hydraulic head for the coolant exiting all the reservoirs, which encourages the outflow of coolant from the reservoirs to feed into the suction return evenly.

In accordance with various embodiments, the coolant height and temperature measurements may be communicated to a system controller. The system controller may be configured to make determinations regarding the coolant height and temperature, as well as direct the reservoir controller to change coolant levels if necessary. For example, using a Modbus remote terminal unit (RTU), programmable logic controller (PLC) controller, or a controller area network (CAN), multiple reservoir controllers may communicate with the shared controller. In this way, the shared controller may determine a current average coolant height for a plurality of reservoirs and compare that to a target average coolant height for the plurality of reservoirs. In instances in which the current coolant height in any or all of the plurality of reservoirs is above or below the target average coolant height, flow adjustments may be made to bring coolant height in each reservoir to the target average. The reservoir controller(s) may thus adjust the coolant levels in response to receiving instructions to do so from the shared controller.

The coolant level reflects not only the mass of coolant, but also the coolant temperature since the volume of coolant for a given mass will change as a function of coolant bulk temperature. Thus, a low coolant level for coolant that is at a relatively high temperature may be more alarming than the same low coolant level for coolant that is at a relatively low temperature. In response to detecting a temperature change across the reservoirs, various embodiments may change a target average reservoir coolant height accordingly.

In accordance with various embodiments, a central or unified control system may evaluate various elements of the systems parameters to report abnormal situation and may autonomously adjust things to a safe coolant level in the event of communication loss between control elements of the more than one return reservoir monitoring and control elements. In addition, or alternatively, individual coolant level controllers for each component cooling tank may operate autonomously, which may provide a backup or failsafe upon failure of the main system controller. Each of the plurality of reservoirs may communicate their respective coolant level and temperature to a shared controller for determining a current average coolant level, which may be used as a control point. That control point may be used to determine a new target average coolant height, which considers the current coolant temperature. That new target average coolant height may be used to adjust coolant heights in all the reservoirs accordingly.

Figure 1A:
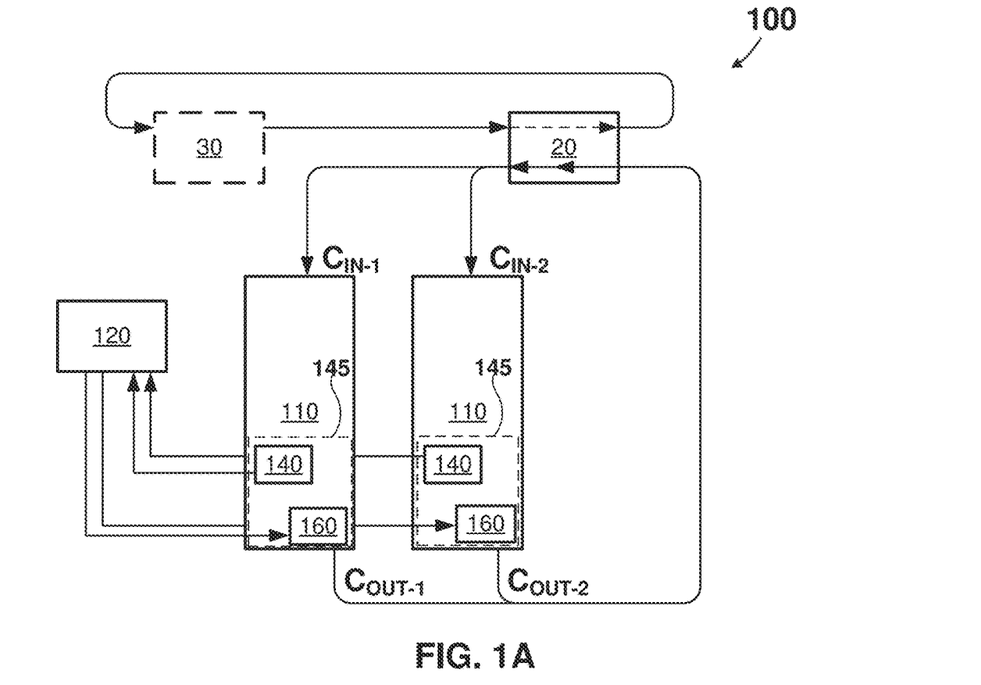
FIG. 1A is a schematic view of a single-phase cooling distribution unit used to cool two component cooling tanks in accordance with various embodiments.

FIG. 1A illustrates a single-phase cooling distribution system 100 suitable for various embodiments. The single-phase cooling distribution system 100 includes a single-phase cooling distribution unit 20 configured to remove thermal energy from two or more component cooling tanks 110, which may be open racks. In particular, FIG. 1A includes two component cooling tanks 110 being cooled by the single-phase cooling distribution unit 20. The single-phase cooling distribution unit 20 may include a coolant pump that circulates the coolant through a coolant-to-water heat exchanger. The water passing through the heat exchanger may be configured to absorb heat from the heated coolant and dissipate the absorbed heat in a cooling tower 30, such as an evaporative cooling tower, dry cooler, existing chilled water loop, or other cooling system. The heated coolant absorbs heat form electronic components disposed within the component cooling tanks 110. The heated coolant may be circulated to the coolant-to-water heat exchanger included in the single-phase cooling distribution unit 20. Cooled coolant may be circulated from the coolant-to-water heat exchanger included in the single-phase cooling distribution unit 20 back into the component cooling tanks 110. Alternatively, an open loop cooling water supply and disposal system may be used. The single-phase cooling distribution unit 20 may circulate coolant as a coolant input flow rate $C_{IN-1}$, $C_{IN-2}$ through each of the two component cooling tanks 110 to dissipate the thermal energy generated by electronic equipment disposed therein (i.e., components). The individual component cooling tanks 110 are considered "open" or referred to as "open racks," if they have a liquid to air interface with the air at atmospheric pressure. The component cooling tanks 110 may have lids or covers but need not be sealed closed to allow the air to maintain atmospheric pressure. The individual component cooling tanks 110 may be configured to hold computing devices that generate heat. The component cooling tanks 110 are configured to receive and hold the circulating single-phase coolant used to dissipate that heat. Heated coolant may exit the component cooling tanks 110 as a coolant exit flow rate ($C_{OUT-1}$, $C_{OUT-2}$), which be recirculated back to the single-phase cooling distribution unit 20 for the cycle to repeat. Although FIG. 1 shows two (2) component cooling tanks 110, alternative embodiments may have three or more component cooling tanks 110.

As the temperature of the coolant heats up, the coolant expands, which means the volume of coolant increases and the density thereby decreases. The opposite occurs when the coolant cools down. Since each of the component cooling tanks may contain different electronic components, a different number of electronic components, and/or electronic components that are operating at different levels causing different heat generation. Thus, an uneven generation of heat may occur among different component cooling tanks 110. As a result, the volume of coolant retained within the individual component cooling tanks 110 may also vary. This also results in all or many of the component cooling tanks 110 potentially having different coolant exit flow rates $C_{OUT-1}$, $C_{OUT-2}$. Such disparities between component cooling tanks 110 may cause a potential for unequal flow between parallel open component cooling tanks 110. This unequal flow may create the possibility of component cooling tanks 110 having unequal coolant heights, particularly between their reservoirs when included. A reservoir of a component cooling tank may have the coolant level contained therein drop below a level of an outlet duct. This may in-turn cause air to be pulled into the pipes and pump(s) circulating the coolant. In some cases, the imbalance may create unusually high coolant levels in one or more of the component cooling tanks 110 or the reservoirs, creating the risk of overflow and coolant being lost from the containment system.

The thermal expansion/contraction of coolant as it cycles between minimum and maximum temperatures further complicates the matter. Reservoirs of the component cooling tanks 110 may be configured to buffer the volumetric change of dielectric coolant fluid over normal temperature ranges. However, as the volume and therefore level of coolant changes, due to thermal temperature changes, a simple mechanical float mechanism cannot compensate for the phenomena.

Various embodiments include a system for controlling coolant levels in two or more component cooling tanks 110 sharing the single-phase cooling distribution system 100. The system for controlling coolant levels may include coolant level regulator components 145 in each of the component cooling tanks 110, as well as a controller 120 communicatively coupled to the coolant level regulator components 145. The coolant level regulator components 145 may include a temperature sensor 140 and a coolant release valve 160. Each temperature sensor 140 may be configured to measure a temperature of the coolant in a reservoir of the respective component cooling tanks 110. Additionally, or alternatively, the temperature sensor 140 may be configured to measure air temperature, liquid temperature, or the temperature of solid matter. For example, the temperature sensor 140 may include a thermistor, resistance temperature detector (RTD), thermocouple, temperature probe, etc. Also, each coolant release valve 160 may be configured to regulate the release of coolant from the reservoir of the respective component cooling tanks 110. A processor of the controller 120 may be configured to receive temperature measurements from the temperature sensors 140. Also, based on the received temperature measurements, a processor of the controller 120 may determine a target coolant level for the reservoirs, which may require adjusting levels of the coolant in at least one of the reservoirs by the corresponding coolant release valves 160. The controller 120 may signal the determined target coolant level to one or both of the coolant release valves 160. Such a signal from the controller 120 may take the form of a target coolant level update. The target coolant level update may be configured to cause one or both of the coolant release valves 160 to adjust the coolant levels in their respective reservoirs.

Additionally, each of the coolant level regulator components 145 may include a coolant level detector. A coolant level detector may be configured to detect a level of the coolant in the reservoir, which may be useful to determine whether to adjust a release of the coolant from the reservoir.

As a further alternative and/or addition, each of the coolant release valves 160 may be managed by a coolant level controller, which may be a further component of the coolant level regulator components 145. In this way, the controller 120 may signal the coolant level controller, which may in-turn adjust its corresponding coolant release valve 160, if necessary.

Various embodiments may use multiple immersion cooling rack assemblies 110 in parallel to reduce the cost per space of cooling. For example: four immersion cooling rack assemblies 110 of approximately 50 U may be connected to a single pump. While some datacenters use the same information technology load in each area or immersion cooling rack assembly 110, some collocation facilities may have different loads from one immersion cooling rack to another. Customer may only require a single rack of space, which needs far fewer resources than a customer using multiple racks.

Figure 1B:
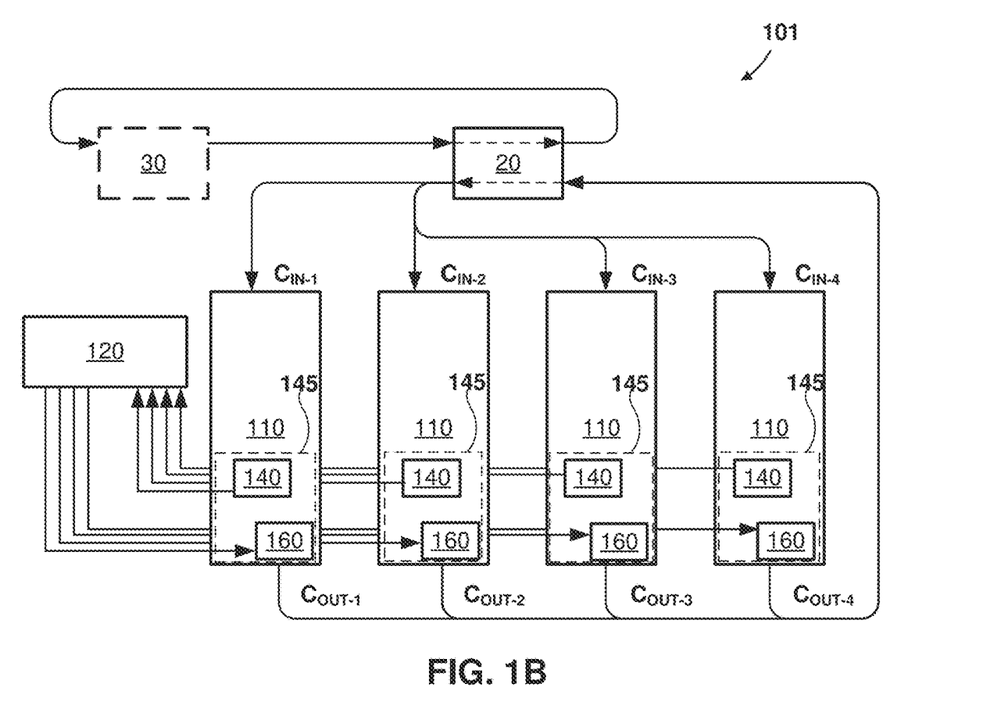
FIG. 1B is a schematic view of a single-phase cooling distribution unit used to cool four component cooling tanks in accordance with various embodiments.

FIG. 1B illustrates another single-phase cooling distribution system 101 suitable for various embodiments. The single-phase cooling distribution system 101 includes a single-phase cooling distribution unit 20 configured to remove thermal energy from four component cooling tanks 110, similar to those components described above with regard to FIG. 1A. The single-phase cooling distribution unit 20 may circulate coolant at a coolant input flow rate $C_{IN-1}$, $C_{IN-2}$, $C_{IN-3}$, $C_{IN-4}$ through each of the four component cooling tanks 110 to dissipate the thermal energy generated by electronic equipment disposed therein. In addition, the component cooling tanks 110 may potentially have different coolant exit flow rates $C_{OUT-1}$, $C_{OUT-2}$, $C_{OUT-3}$, $C_{OUT-4}$. Although FIG. 1B shows four (4) component cooling tanks 110, alternative embodiments may have three or more than four component cooling tanks 110. Like the single-phase cooling distribution system 100 described above with regard to FIG. 1A, the single-phase cooling distribution system 101 may include a system for controlling coolant levels, which may include similar coolant level regulator components 145 in each of the component cooling tanks 110, as well as the controller 120 communicatively coupled to the coolant level regulator components 145. Also, the coolant level regulator components 145 may include the temperature sensor 140 and the coolant release valve 160, which the controller 120 may use to determine target coolant level updates for adjusting levels of the coolant in at least one of the reservoirs in the component cooling tanks 110.

Figure 2A:
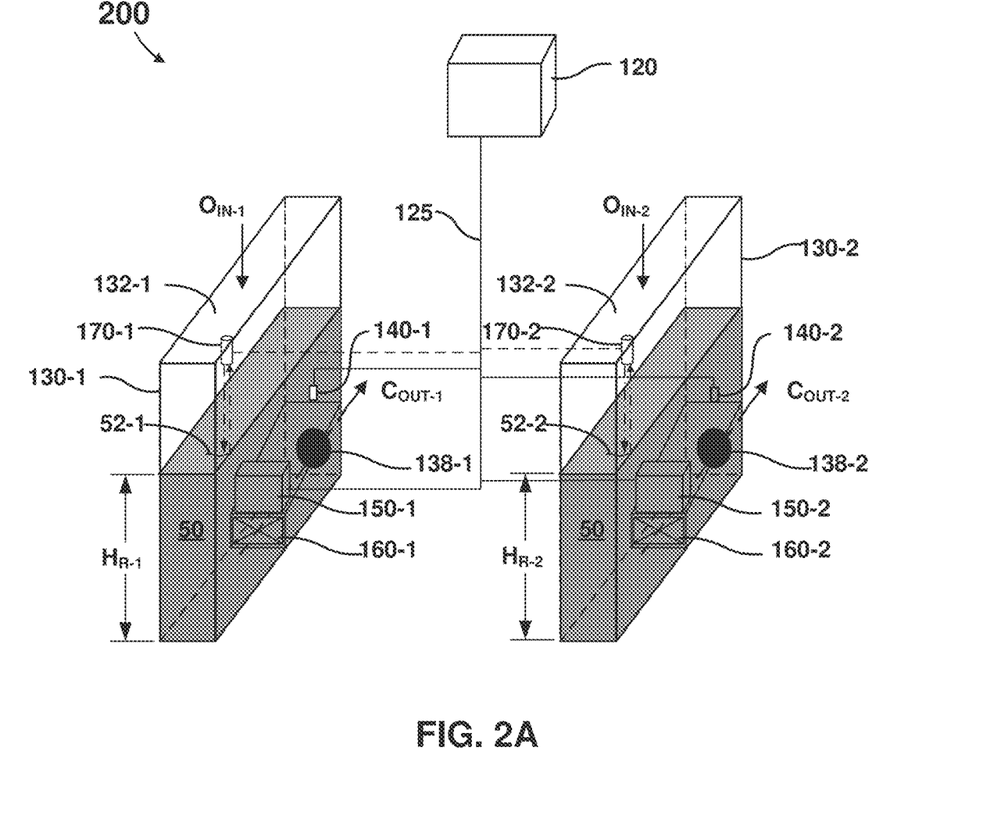
FIG. 2A is a perspective view of a system schematic for controlling coolant levels in component cooling tanks sharing a unified coolant distribution system in accordance with various embodiments.

FIG. 2A illustrates various aspects of a system 200 for controlling coolant levels in two component cooling tanks (e.g., 110 in FIG. 1A) sharing a unified coolant distribution system in accordance with various embodiments. The system 200 may include the controller 120, which is communicatively coupled to coolant level regulator components, such as the temperature sensors 140-1, 140-2 and the coolant release valves 160-1, 160-2. The controller 120 may have a wired and/or wireless connection directly to the coolant level regulator components (e.g., the temperature sensors 140-1, 140-2 and the coolant release valves 160-1, 160-2) in each reservoir 130-1, 130-2. For example, the controller 120 may use a communication BUS 125 configured to communicatively couple the controller 120 to the coolant level regulator components. Alternatively, the controller 120 may have a wired and/or wireless connection to a coolant level controller 150-1, 150-2, which may be coupled to one or more of the coolant level regulator components.

The reservoirs 130-1, 130-2 may be configured to hold coolant 50 therein. In various embodiments, the reservoirs 130-1, 130-2 may be configured to operate as overflow reservoirs, receiving overflow coolant from larger holding tanks, such as ones holding electronic components being cooled. The overflow coolant may flow into each of the reservoirs 130-1, 130-2 through an open top 132-1, 132-2 or other aperture at different overflow input flow rates $O_{IN-1}$, $O_{IN-2}$. In some embodiments, the reservoirs 130-1, 130-2 may be configured as an outflow reservoir configured to collect coolant prior to it exiting through an outlet duct 138-1, 138-2. The reservoirs 130-1, 130-2 may have extra headspace (i.e., volume) to buffer volumetric changes in coolant due to temperature changes. In addition, the reservoirs 130-1, 130-2 may potentially have different coolant exit flow rates $C_{OUT-1}$, $C_{OUT-2}$. Alternatively, each reservoir 130-1, 130-2 may form the main component holding reservoir of that respective component cooling tank (i.e., a tank without an overflow reservoir). In this way, the overflow input flow rate $O_{IN-1}$, $O_{IN-2}$ would be the equivalent to the coolant input flow rates $C_{IN-1}$, $C_{IN-2}$ described above with regard to FIG. 1A. Although the system 200 includes only two reservoirs 130-1, 130-2, additional reservoirs and/or component cooling tanks may be included.

At room temperature or some other setup temperature, an initial coolant height $H_{R\text{-}init}$ of the surface level 52-1, 52-2 of the coolant 50 in each reservoir 130-1, 130-2 may be known, as well as the corresponding initial temperature $T_{init}$ (e.g., room temperature) and initial density of the coolant 50. Similarly, since the dimensions of each reservoir 130-1, 130-2 are known, a horizontal cross-sectional area $A_R$ of each reservoir 130-1, 130-2 (or an average thereof) may be used in conjunction with the initial coolant height $H_{R\text{-}init}$ to determine an initial coolant volume $V_{init}$. Over time, as the electronic components being cooled generate heat and such heat is transferred to the coolant, the temperature of the coolant 50 may increase. Also, as the temperature of the coolant 50 increases, fluid expansion may cause the coolant levels $H_{R\text{-}1}$, $H_{R\text{-}2}$ to rise in each of the reservoirs 130-1, 130-2. In addition, the temperature of the coolant 50 in different reservoirs 130-1, 130-2 may vary since there may be variations in the amount of heat generated by the electronic components in different component cooling tanks. Thus, the coolant level rise may also vary from tank to tank.

In accordance with various embodiments, each reservoir 130-1, 130-2 may include a set of coolant level regulator components, which are configured to control the coolant levels $H_{R\text{-}1}$, $H_{R\text{-}2}$ in each of the reservoirs 130-1, 130-2. In this way, a first reservoir 130-1 (e.g., associated with a first component cooling tank) may include first coolant level regulator components. Similarly, a second reservoir 130-2 (e.g., associated with a second component cooling tank) may include second coolant level regulator components. As described above, the coolant level regulator components may include a temperature sensor 140 and a coolant release valve 160-1, 160-2. Each temperature sensor 140-1, 140-2 may be configured to measure a temperature of the coolant 50 in one of the reservoirs 130-1, 130-2. Also, each coolant release valve 160-1, 160-2 may be configured to regulate the release of coolant from one of the reservoirs 130-1, 130-2 through the outlet ducts 138-1, 138-2.

A processor of the controller 120 may receive a first temperature measurement $T_1$ from a first temperature sensor 140-1 of the first reservoir 130-1 and receive a second temperature measurement $T_2$ from a second temperature sensor 140-2 of the second reservoir 130-2. Using the received temperature measurements $T_1$, $T_2$, the processor may determine a current average reservoir temperature $T_{Avg}$. (e.g., $(T_1+T_2)/2=T_{Avg}$). In a system with more than two reservoirs, temperature measurements from the additional reservoirs may be included in the temperature average calculation.

The coolant 50 used in the reservoirs 130-1, 130-2 (e.g., a dielectric coolant) may have well known properties, such as density $\rho$, which may vary with temperature. As noted above, an initial coolant temperature $T_{init}$ may be known, such as an ambient temperature (i.e., room temperature). In addition, since the density variations based on temperature are generally known, a correlation between temperature and density may be maintained in a lookup table, such as in memory of the controller 120 and/or one or more of the coolant level controllers 150-1, 150-2. Thus, the initial coolant temperature $T_{init}$ will have a corresponding initial coolant density $\rho_{init}$. Also, as coolant temperatures change, the processor of the controller 120, may use the lookup table to convert (i.e., translate) an average of the current measured temperatures (i.e., a temperature average) into an estimation of current average coolant density (i.e., a density average). For example, an average coolant temperature $T_{Avg}$ may be translated into an average coolant density $\rho_{Avg}$.

Based on temperatures measured by the temperature sensors 140-1, 140-2 and the corresponding coolant density thereof, the controller 120 may determine a target coolant height $H_T$, which may correspond to an optimal coolant level that should be maintained across all the reservoirs 130-1, 130-2. The processor may then use the coolant level regulator components to ensure or at least encourage the reservoir coolant levels get adjusted to or maintained at the target coolant height $H_T$. For example, the processor may use the following equation to determine a target coolant height $H_T$:

$$H_T = V_{init} * (\rho_{init}/\rho_{avg} - 1)/A_R + H_{R\text{-}init} \qquad (1)$$

In equation (1), $H_T$ represents the target coolant height, $V_{init}$ represents the initial coolant volume (e.g., at setup), $\rho_{init}$ represents the initial coolant density, $\rho_{avg}$ represents an average coolant density based on the average measured coolant temperature (e.g., $T_{Avg}$), $A_R$ represents the horizontal cross-sectional area of each reservoir 130-1, 130-2, and $H_{R\text{-}init}$ represents the initial coolant height in the reservoirs 130-1, 130-2. Alternatively, the processor may use a lookup table to directly determine the target coolant height $H_T$ based on the average measured coolant temperature $T_{Avg}$.

Once the target coolant height $H_T$ is determined, the controller 120 may initiate operations to control the coolant release valves 160-1, 160-2 for adjusting coolant levels in the reservoirs 130-1, 130-2. For example, the controller 120 may signal a target coolant level update. The target coolant level update may be based on the determined target coolant height $H_T$, for adjusting levels of the coolant 50 in at least one of the first reservoir 130-1 or the second reservoir 130-2. The target coolant level update may be a control signal transmitted directly to one or both of the first coolant release valve 160-1 and/or the second coolant release valve 160-2. The first coolant release valve 160-1 and the second coolant release valve 160-2 may be adjustable, which in-turn adjusts a release of the coolant from the first reservoir 130-1 and the second reservoir 130-2, respectively. The control signal may selectively open or close the first and/or second coolant release valve 160-1, 160-2 to increase, maintain, or decrease the coolant levels therein. Alternatively, each reservoir 130-1, 130-2 may have an independent microcontroller, such as the coolant level controllers 150-1, 150-2, that provide proportional integral derivative (PID) closed loop control to adjust coolant exit flow rates $C_{OUT\text{-}1}$, $C_{OUT\text{-}2}$ of specific reservoirs 130-1, 130-2 for adjusting and/or maintaining target coolant levels (e.g., $H_T$).

Figure 2B:
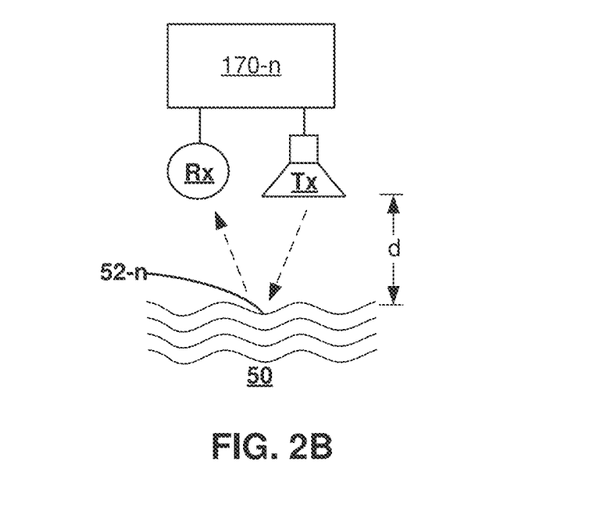
FIG. 2B is a schematic relief view of a coolant level detector suitable for use with various embodiments.

In various embodiments, the coolant level regulator components of the system 200 may also include one or more coolant level detectors configured to detect a level of the coolant 50 in the reservoirs 130-1, 130-2. For example, a first coolant level detector 170-1 may be disposed in or on the first reservoir 130-1. Similarly, a second coolant level detector 170-2 may be disposed in or on the second reservoir 130-2. One or both of the first coolant level detector 170-1 and the second coolant level detector 170-2 may be an ultrasonic fluid level meter, which is configured to provide precise fluid level measurements. FIG. 2B illustrates an ultrasonic coolant level detector 170-n (i.e., 170-1 and/or 170-2) suitable for use with various embodiments. The ultrasonic coolant level meter 170-n may be a contactless measurement device that transmits (Tx) and receives (Rx)

high frequency acoustic waves to measure the distance d to the surface 52-n of the coolant 50.

Alternatively, the first coolant level detector 170-1 and the second coolant level detector 170-2 may be capacitance sensors, which may use probes that detect when the dielectric coolant level changes (i.e., rises or recedes). As the coolant level changes, the capacitance will change and provide an indication of the coolant level. As a further alternative, the first coolant level detector 170-1 and the second coolant level detector 170-2 may be pressure sensors configured to measure coolant level. As a further alternative, a float-type fluid level meter may be included, which tends to provide less accurate measurements, but may save costs. Other sensors may be used to alternatively, or additionally, measure the coolant levels $H_{R-1}$, $H_{R-2}$ in the reservoirs 130-1, 130-2.

The first coolant level detector 170-1 and the second coolant level detector 170-2 may be configured to measure and report the coolant levels $H_{R-1}$, $H_{R-2}$ to the controller 120 and/or their respective coolant level controllers 150-1, 150-2, if included. The controller 120 and/or the coolant level controllers 150-1, 150-2 may compare the current coolant levels $H_{R-1}$, $H_{R-2}$ to those indicated in the target coolant level update (e.g., $H_T$). In instance in which any of the current coolant levels $H_{R-1}$, $H_{R-2}$ are above the target coolant level $H_T$ indicated by the target coolant level update, then the controller 120 or the respective coolant level controller 150-1, 150-2 may either open or further open the first and/or second coolant release valve(s) 160-1, 160-2 to increase the coolant exit flow rates $C_{OUT-1}$, $C_{OUT-2}$.

Figure 3A:
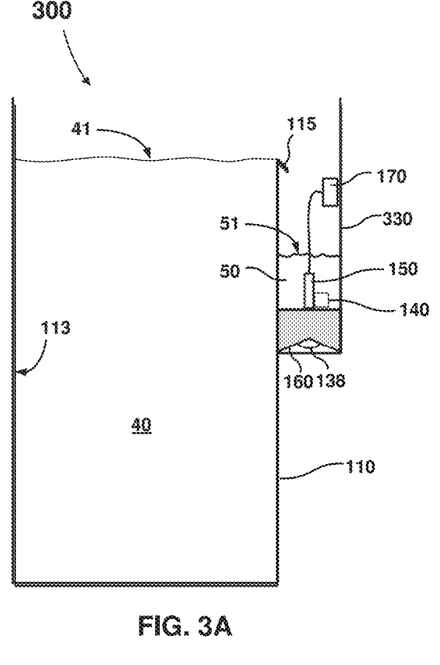
FIGS. 3A and 3B are vertical cross-sectional views of a component cooling tank including a reservoir with a coolant release valve in closed and open positions, respectively, in accordance with various embodiments.
Figure 3B:
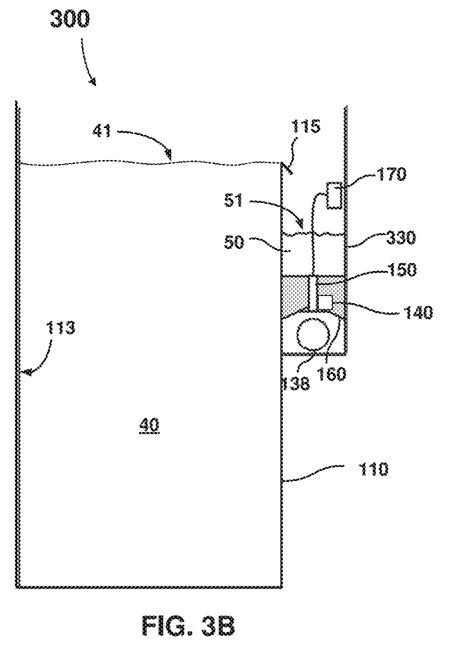

FIGS. 3A and 3B illustrate a system 300 with a component cooling tank 110 that includes a main component reservoir 113 and an outflow reservoir 330 with coolant level regulator components for controlling coolant levels in the outflow reservoir 330 in accordance with various embodiments. The outflow reservoir 330 may include the coolant release valve 160. FIG. 3A illustrates the coolant release valve 160 in a closed position and FIG. 3B illustrates the coolant release valve 160 in an open position. In various embodiments, the fully closed position of the coolant release valve 160 (as shown in FIG. 3A) may not completely close-off or prevent coolant fluid from flowing out the outlet duct 138 of the outflow reservoir 330.

The main component reservoir 113 may be configured to hold electronic components and includes a weir 115 that is configured to allow spill-over of coolant 40 from the main component reservoir 113 to the outflow reservoir 330. In this way, in instances in which a top surface 41 of the coolant 40 reaches the level of the weir 115, any additional coolant 40 will spill over the weir 115 into the outflow reservoir 330. The outflow reservoir 330 may be similar to the reservoirs described herein with regard to other embodiments (e.g., reservoir 130).

In addition to or as an alternative to the weir 115, a simple partition wall or siphon ports may be included at the top of a wall between the main component reservoir 113 and outflow reservoir 330 instead of or in addition to the weir 115. As a further alternative, regulated siphon ports may be included almost anywhere between the main component reservoir 113 and the outflow reservoir 330 to transfer excess coolant 40 therebetween.

The outflow reservoir 330 may include coolant level regulator components, as described above, including the temperature sensor 140 and the coolant release valve 160. The temperature sensor 140 is configured to measure the temperature of the coolant 50 in the outflow reservoir 330. The coolant release valve 160 may be configured to regulate the release of coolant 50 from the outflow reservoir 330. In addition, the coolant level regulator components may include the coolant level controller 150, which may more directly control the coolant release valve 160 and receive measurements from the temperature sensor 140. Further, the coolant level regulator components may include the coolant level detector 170, which may be configured to detect a coolant level of a top surface 51 of the coolant 50 in the outflow reservoir 330.

The outflow reservoir 330 may be a separate tank from the component coolant tank 110 that forms the main component reservoir 113. The outflow reservoir 330 is configured to receive overflow coolant from the main component reservoir 113. The weir 115 may extend along an upper extent of the barrier separating the component coolant tank 110 from the overflow reservoir 330. Also, that barrier between the two tanks 110, 330 may be lower than the other walls of the component coolant tank 110. The weir 115 may be formed as a flat horizontal strip, configured to allow excess coolant 40 to spill out from the component coolant tank 110, over the weir 115, and into the outflow reservoir 330. In various embodiments, the weir 115 may extend from one side of the component coolant tank 110 to the other. In other embodiments, the weir 115 may only extend across a portion of the component coolant tank 110. In other embodiments, more than one weir 115 may be provided, each extending across different portions of the component coolant tank 110. In this manner, a weir 115 may be disposed on any and all edges of the component coolant tank 110 so that the component coolant tank 110 has one or more outflow reservoirs 330 around some or all of the perimeter of the component coolant tank 110.

Figure 4A:
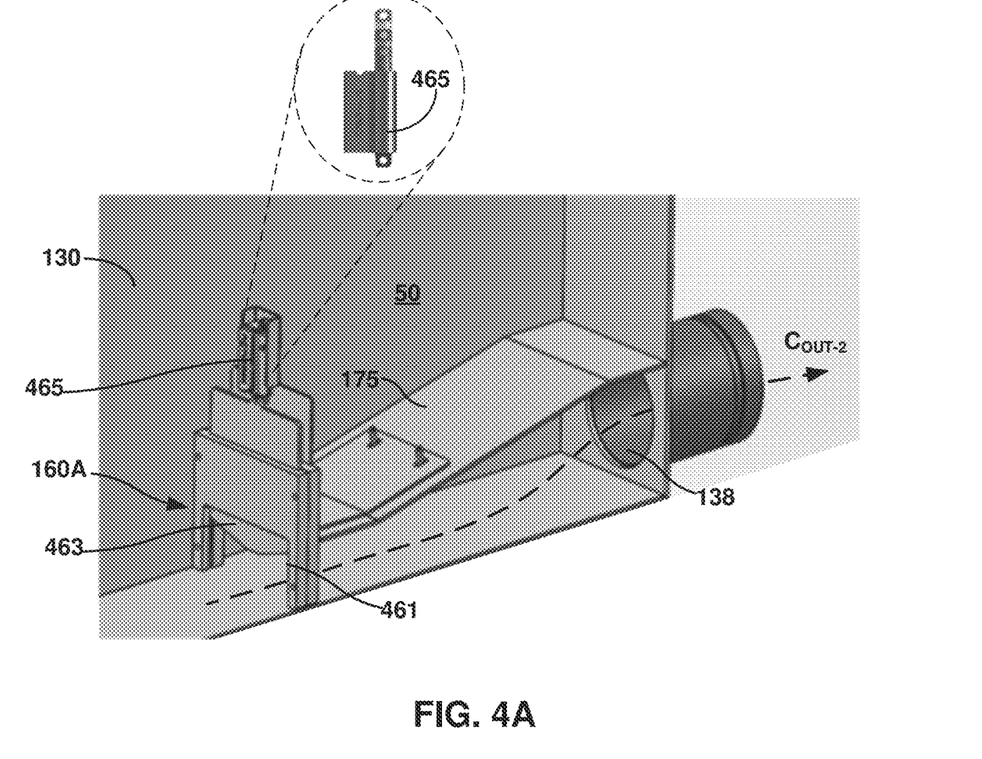
FIG. 4A is a perspective relief view of a linear coolant release valve in a reservoir in accordance with various embodiments.
Figure 4B:
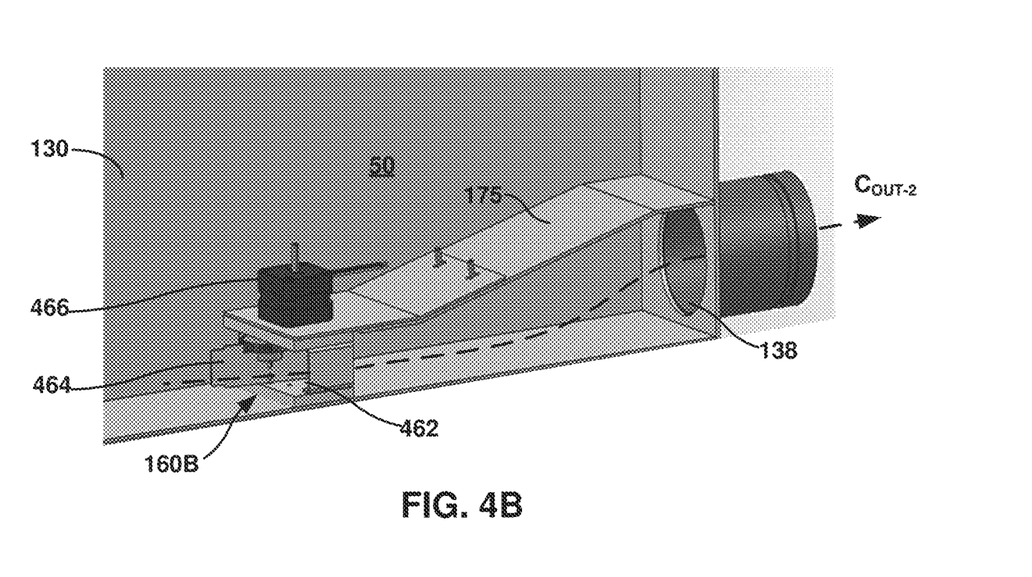
FIG. 4B is a perspective relief view of a rotary coolant release valve in a reservoir in accordance with various embodiments.

FIGS. 4A and 4B illustrate different types of coolant release valves 160A, 160B for component coolant tanks in accordance with various embodiments. In particular, FIG. 4A illustrates a linear coolant release valve 160A and FIG. 4B illustrates a rotary coolant release valve 160B. The coolant release valves 160A, 160B may be disposed at the bottom of the reservoir 130, with a whirlpool shield 175 disposed between each of the coolant release valves 160A, 160B and their respective outlet duct 138. It may be advantageous to position the outlet duct 138 as low as possible within the reservoir 130 to maximize variance volume. Variance volume may be defined by the difference in volume of fluid in the collection zone between max and min levels.

The whirlpool shield 175 may ensure only coolant 50, and not air, is suctioned through the outlet duct 138. The intake or suctioning of air into the outlet duct 138 may damage a pump (not shown) that is used to circulate the coolant 50. The whirlpool shield 175 may be mounted inside the reservoir 130 above the outlet duct 138 for the coolant 50 to exit the reservoir 130. A first end of the whirlpool shield 175 may be attached to a side wall of the reservoir 130, such as the side wall including the outlet duct 138. The whirlpool shield 175 may extend away from the first end (i.e., and the outlet duct 138) toward a second end disposed further from the outlet duct 138 than the first end. The second end of the whirlpool shield 175 may be attached to the coolant release valve 160A, 160B. Also, the whirlpool shield 175 may extend downward at an angle (i.e., with a slope) such that the second end of the whirlpool shield 175 is vertically lower than the first end of the whirlpool shield 175. Alternatively, the whirlpool shield 175 may be formed to have an L-shape, extending away from the outlet 138, toward the central part of the reservoir 130, and then bending downward at a remote end thereof. Including the whirlpool shield 175 may lower the minimum coolant level needed to be maintained in the reservoir 130 before air gets sucked into the outlet duct 138. In addition, the whirlpool shield 175 may prevent air bubbles caused by coolant 50 flowing over the weir 115 into the reservoir 130 from entering the outlet duct 138. In other words, the whirlpool shield 175 may ensure only fluid is expelled from the bottom of the collection zone. Also, the whirlpool shield 175 may prevent whirlpool flows inside the reservoir 130, particularly right next to the outlet duct 138. For example, with the whirlpool shield 175 mounted immediately above a 2.5" diameter outlet duct aperture, the minimum fluid height may be lowered by inches, such as ½" from the bottom of the reservoir 130. The fluid 50 in the reservoir 130 will be forced under the second end of the whirlpool shield 175.

In FIG. 4A the linear coolant release valve 160A may include a valve frame 461 and a linear slide door 463 configured to move up and down for opening and closing the linear coolant release valve 160A and thus changing the size of the exit opening leading to the outlet duct 138 below the whirlpool shield 175. Actuation of the sliding motion of the linear slide door 463 may be controlled by a linear servo 465, which may in-turn be controlled by a controller (e.g., 120 and/or 150, 150-n). Optionally, a lower edge of the linear slide door 463 may not be straight or at least leave some form of gap, which allows at least a small amount of coolant 50 exit flow $C_{OUT-2}$ to leak through the linear coolant release valve 160A in the fully closed position.

In FIG. 4B the rotary coolant release valve 160B may include a valve frame 462 and a rotary pivot door 464 configured to rotate or pivot around a vertical axis for opening and closing the rotary coolant release valve 160B and thus changing the size of the exit opening leading to the outlet duct 138 below the whirlpool shield 175. Alternatively, the rotary pivot door 464 could rotate or pivot about a horizontal axis, such as one perpendicular to the exit flow $C_{OUT-2}$. Actuation of the rotating or pivotal motion of the rotary pivot door 464 may be controlled by a rotary servo 466, which may in-turn be controlled by a controller (e.g., 120 and/or 150, 150-n). Optionally, the rotary pivot door 464 may not fully close off the opening in the valve frame 462, leaving some form of gap, which allows at least a small amount of coolant 50 to leak through the rotary coolant release valve 160B in the fully closed position.

In the embodiments illustrated in FIGS. 4A and 4B, the coolant release valves 160A, 160B that regulate the flow of dielectric coolant fluid out of the reservoir 130 may be disposed inside a portion of the reservoir 130. Alternatively, the coolant release valves 160A, 160B may be disposed outside the reservoir 130, such as between the reservoir 130 and shared manifold.

Figure 5:
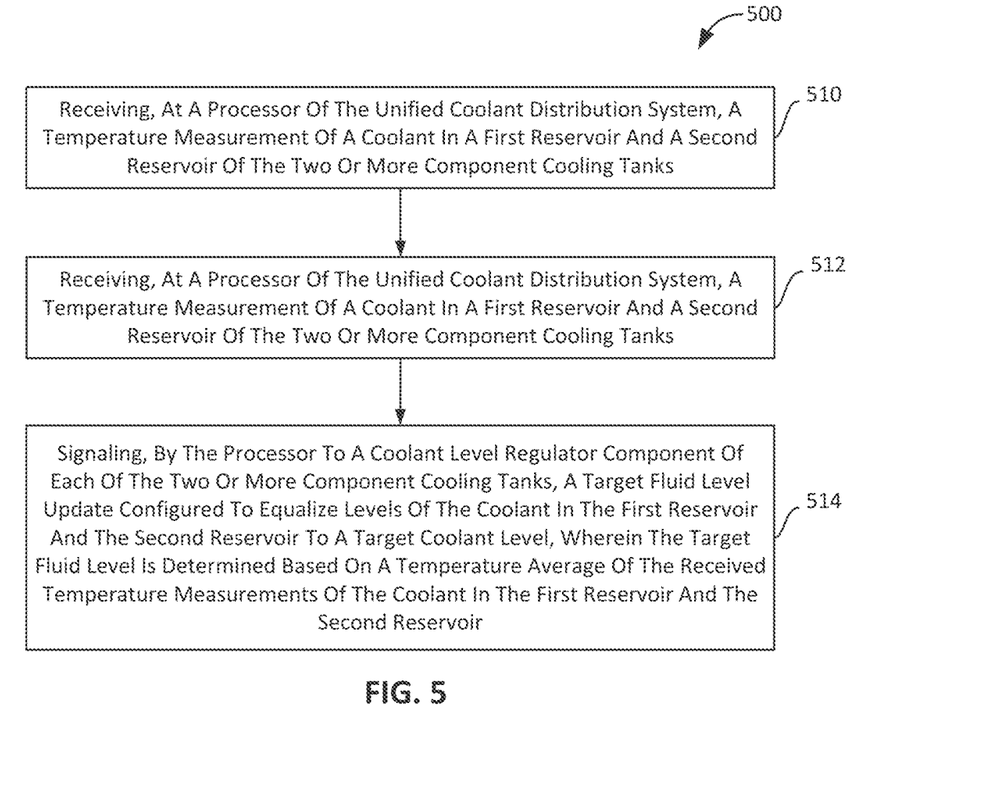
FIG. 5 is a process flow diagram of a method for controlling coolant levels in two or more component cooling tanks sharing a unified coolant distribution system in accordance with various embodiments.

FIG. 5 is a process flow diagram of a method 500 for controlling coolant levels in two or more component cooling tanks sharing a unified coolant distribution system in accordance with various embodiments. With reference to FIGS. 1A-5, means for performing each of the operations of the method 500 may be a processor of the controller (e.g., 120, 150, 150-1, 150-2) of the of the unified coolant distribution system and/or another processor associated with the unified coolant distribution system, and/or the like.

In block 510, the processor may receive a temperature measurement of a coolant in a first reservoir (e.g., 130-1) and a second reservoir (e.g., 130-2) of the two or more component cooling tanks (e.g., 110). The received temperature measurements from the first reservoir (e.g., 130-1) and second reservoir (e.g., 130-2) may not be the same. The received temperature measurements may anticipate fluid level changes, which are a function of temperature changes from a known fluid level.

In some embodiments after receiving the temperature measurement in block 510, the processor may receive a coolant level measurement of the coolant in the first reservoir and/or the second reservoir in block 512. Alternatively, the processor may receive the coolant level measurement(s) before receiving the temperature measurement in block 510. The processor may use the received coolant level measurement(s) to determine the target coolant level update. For example, the received coolant level measurement(s) may be used to confirm a coolant level determined from the measured coolant temperature.

In block 514, the processor may signal to a coolant level regulator component (e.g., 145) of each of the two or more component cooling tanks (e.g., 110), a target coolant level update. The target coolant level update may be configured to equalize levels of the coolant in the first reservoir and second reservoir to a target coolant level. Also, the target coolant level may be determined based on a temperature average of the received temperature measurements of the coolant in the first reservoir and the second reservoir. In some embodiments, signaling the target coolant level update includes directly activating at least one of a first coolant release valve (e.g., 160, 160-1) that regulates the release of coolant from the first reservoir or a second coolant release valve (e.g., 160, 160-2) that regulates the release of coolant from the second reservoir. In some embodiments, signaling the target coolant level update(s) may include using updated coolant temperature measurements (e.g., from the temperature sensor 140, 140-1, 140-2) and/or coolant level measurements (e.g., from the coolant level detector 170, 170-1, 170-2) to determine whether coolant should be released from the first and/or second reservoir to meet the coolant level indicated in the target coolant level update.

In some embodiments, the target coolant level update signaled by the processor may be determined by converting the temperature average of the received temperature measurements to a density average of the coolant in the first reservoir and the second reservoir. In some embodiments, signaling the target coolant level update may include signaling a first coolant level controller (e.g., 150, 150-1) configured to control a first coolant release valve that regulates the release of coolant (e.g., 40, 50) from the first reservoir, as well as signaling a second coolant level controller (e.g., 150, 150-2) configured to control a second coolant release valve (e.g., 160, 160-2) that regulates the release of coolant from the second reservoir. The first coolant level controller may use the received target coolant level update, in conjunction with updated coolant temperature measurements (e.g., from the temperature sensor 140, 140-1) and/or coolant level measurements (e.g., from the coolant level detector 170, 170-1) to determine whether coolant should be released from the first reservoir to meet the coolant level indicated in the received target coolant level update. Similarly, the second coolant level controller may use the received target coolant level update, in conjunction with updated coolant temperature measurements (e.g., from the temperature sensor 140, 140-2) and/or coolant level measurements (e.g., from the coolant level detector 170, 170-2) to determine whether coolant should be released from the second reservoir to meet the coolant level indicated in the received target coolant level update. In some embodiments, signaling the target coolant level update includes directly activating at least one of a first coolant release valve that regulates the release of coolant from the first reservoir or a second coolant release valve that regulates the release of coolant from the first reservoir.

The operations of the method 500 may be performed continuously or periodically to adjust, maintain, and/or control coolant levels in the two or more component cooling tanks sharing the unified coolant distribution system.

Implementation examples are described in the following paragraphs. While some of the following implementation examples are described in terms of an example computing device memory system, further example implementations may include: the example functions of the computing device memory system discussed in the following paragraphs implemented as methods of the following implementation examples; and the example computing device memory system discussed in the following paragraphs implemented by a computing device memory system including means for performing functions of the computing device memory system of the following implementation examples.

Example 1. A system for controlling coolant levels in a plurality of component cooling tanks sharing a unified coolant distribution system, comprising: first coolant level regulator components of a first component cooling tank comprising: a first temperature sensor configured to measure a temperature of the coolant in a first reservoir, a first coolant release valve configured to regulate the release of coolant from the first reservoir, and a first coolant level detector configured to detect a level of the coolant in the first reservoir; second coolant level regulator components of a second component cooling tank comprising: a second temperature sensor configured to measure a temperature of the coolant in a second reservoir, a second coolant release valve configured to regulate the release of coolant from the second reservoir, and a second coolant level detector configured to detect a level of the coolant in the second reservoir; and a processor configured to receive the temperature measurements from the first temperature sensor and the second temperature sensor, wherein the processor is configured to signal at least one target coolant level update for adjusting a level of the coolant in the first reservoir by the first coolant release valve, wherein the at least one target coolant level update is determined based on a temperature average of the received temperature measurements from the first temperature sensor and the second temperature sensor, wherein the first coolant release valve is configured to adjust a release of the coolant from the first reservoir in response to comparing the detected level of the coolant in the first reservoir to a target coolant level indicated by the at least one target coolant level update.

Example 2. The system of example 1, wherein the first coolant level detector includes an ultrasonic fluid level sensor.

Example 3. The system of any one or more of examples 1 or 2, wherein the first coolant level regulator components further comprise: a first coolant level controller configured to receive the signaled at least one target coolant level update, wherein the first coolant level controller is configured to activate the first coolant release valve in response to receiving the at least one target coolant level update.

Example 4. The system of example 3, wherein the first coolant level controller is configured to operate independent of the processor configured to receive the temperature measurements from the first temperature sensor and the second temperature sensor.

Example 5. The system of any one or more of examples 1-4, wherein the signaled at least one target coolant level update from the processor is configured to directly control at least the first coolant release valve for regulating the release of coolant associated therewith.

Example 6. The system of any one or more of examples 1-5, wherein the signaled at least one target coolant level update from the processor is determined by converting the temperature average of the received temperature measurements to a density average of the coolant in the first reservoir and the second reservoir.

Example 7. The system of any one or more of examples 1-6, wherein the first coolant release valve includes a linear actuator configured to control a state of a coolant gate regulating the release of coolant.

Example 8. The system of any one or more of examples 1-7, wherein the first coolant release valve includes a rotary actuator configured to control a state of a coolant gate regulating the release of coolant.

Example 9. The system of any one or more of examples 1-8, wherein the processor is further configured to signal the at least one target coolant level update for adjusting a level of the coolant in at least one of the second reservoir by at least the second coolant release valve, wherein the at least one target coolant level update is determined based on the temperature average of the received temperature measurements from the first temperature sensor and the second temperature sensor.

Example 10. The system of example 9, further comprising: third coolant level regulator components of a third component cooling tank comprising: a third temperature sensor configured to measure a temperature of the coolant in a third reservoir, a third coolant release valve configured to regulate the release of coolant from the third reservoir, and a third coolant level detector configured to detect a level of the coolant in the third reservoir; fourth coolant level regulator components of a fourth component cooling tank comprising: a fourth temperature sensor configured to measure a temperature of the coolant in a fourth reservoir, a fourth coolant release valve configured to regulate the release of coolant from the fourth reservoir, and a fourth coolant level detector configured to detect a level of the coolant in the fourth reservoir, wherein the processor is configured to receive the temperature measurements from the third temperature sensor and the fourth temperature sensor, wherein the at least one target coolant level update signaled by the processor is configured to adjust a level of the coolant in at least one of the third reservoir or the fourth reservoir by the third coolant release valve or the fourth coolant release valve, respectively.

Example 11. The system of any one or more of examples 1-10, wherein the first reservoir and the second reservoir are configured to hold an overflow of the coolant from the first component cooling tank and the second component cooling tank, respectively.

Example 12. The system of any one or more of examples 1-11, wherein the first reservoir and the second reservoir are each the largest coolant reservoirs of the first component cooling tank and the second component cooling tank, respectively.

Example 13. A method for controlling coolant levels in two or more component cooling tanks sharing a unified coolant distribution system, comprising: receiving, at a processor of the unified coolant distribution system, temperature measurements of a coolant in a first reservoir and a second reservoir of the two or more component cooling tanks; receiving, at the processor of the unified coolant distribution system, a coolant level measurement of the coolant in the first reservoir; and signaling, by the processor to a coolant level regulator component of each of the two or more component cooling tanks, a target coolant level update configured to equalize levels of the coolant in the first reservoir and the second reservoir to a target coolant level, wherein the target coolant level is determined based on the received coolant level measurement and a temperature average of the received temperature measurements of the coolant in the first reservoir and the second reservoir.

Example 14. The method of example 13, wherein the target coolant level update signaled by the processor is determined by converting the temperature average of the received temperature measurements to a density average of the coolant in the first reservoir and the second reservoir.

Example 15. The method of any one or more of examples 13 or 14, wherein signaling the target coolant level update includes signaling a first coolant level controller configured to control a first coolant release valve that regulates the release of coolant from the first reservoir; and a second coolant level controller configured to control a second coolant release valve that regulates the release of coolant from the first reservoir.

Example 16. The method of any one or more of examples 13-5, wherein signaling the target coolant level update includes directly activating at least one of: a first coolant release valve that regulates the release of coolant from the first reservoir; or a second coolant release valve that regulates the release of coolant from the first reservoir.

The foregoing descriptions of systems, devices, and methods are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are used to guide the reader through the description of the methods. Further, any reference to claim elements in the singular, for example, using the articles "a," "an" or "the" is not to be construed as limiting the element to the singular.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A system for controlling coolant levels in a plurality of component cooling tanks sharing a unified coolant distribution system, comprising:
    first coolant level regulator components of a first component cooling tank comprising:
        a first temperature sensor configured to measure a temperature of the coolant in a first reservoir,
        a first coolant release valve configured to regulate the release of coolant from the first reservoir, and
        a first coolant level detector configured to detect a level of the coolant in the first reservoir;
    second coolant level regulator components of a second component cooling tank comprising:
        a second temperature sensor configured to measure a temperature of the coolant in a second reservoir,
        a second coolant release valve configured to regulate the release of coolant from the second reservoir, and
        a second coolant level detector configured to detect a level of the coolant in the second reservoir; and
    a processor configured to receive the temperature measurements from the first temperature sensor and the second temperature sensor, wherein the processor is configured to signal at least one target coolant level update for adjusting a level of the coolant in the first reservoir by the first coolant release valve, wherein the at least one target coolant level update is determined based on a temperature average of the received temperature measurements from the first temperature sensor and the second temperature sensor, wherein the first coolant release valve is configured to adjust a release of the coolant from the first reservoir in response to comparing the detected level of the coolant in the first reservoir to a target coolant level indicated by the at least one target coolant level update.

2. The system of claim 1, wherein the first coolant level detector includes an ultrasonic fluid level sensor.

3. The system of claim 1, wherein the first coolant level regulator components further comprise:
    a first coolant level controller configured to receive the signaled at least one target coolant level update, wherein the first coolant level controller is configured to activate the first coolant release valve in response to receiving the at least one target coolant level update.

4. The system of claim 3, wherein the first coolant level controller is configured to operate independent of the processor configured to receive the temperature measurements from the first temperature sensor and the second temperature sensor.

5. The system of claim 1, wherein the signaled at least one target coolant level update from the processor is configured to directly control at least the first coolant release valve for regulating the release of coolant associated therewith.

6. The system of claim 1, wherein the signaled at least one target coolant level update from the processor is determined by converting the temperature average of the received temperature measurements to a density average of the coolant in the first reservoir and the second reservoir.

7. The system of claim 1, wherein the first coolant release valve includes a linear actuator configured to control a state of a coolant gate regulating the release of coolant.

8. The system of claim 1, wherein the first coolant release valve includes a rotary actuator configured to control a state of a coolant gate regulating the release of coolant.

9. The system of claim 1, wherein the processor is further configured to signal the at least one target coolant level update for adjusting a level of the coolant in at least one of the second reservoir by at least the second coolant release valve, wherein the at least one target coolant level update is determined based on the temperature average of the received temperature measurements from the first temperature sensor and the second temperature sensor.

10. The system of claim 9, further comprising:
    third coolant level regulator components of a third component cooling tank comprising:
        a third temperature sensor configured to measure a temperature of the coolant in a third reservoir,
        a third coolant release valve configured to regulate the release of coolant from the third reservoir, and
        a third coolant level detector configured to detect a level of the coolant in the third reservoir;
    fourth coolant level regulator components of a fourth component cooling tank comprising:
        a fourth temperature sensor configured to measure a temperature of the coolant in a fourth reservoir, a fourth coolant release valve configured to regulate the release of coolant from the fourth reservoir, and a fourth coolant level detector configured to detect a level of the coolant in the fourth reservoir, wherein the processor is configured to receive the temperature measurements from the third temperature sensor and the fourth temperature sensor, wherein the at least one target coolant level update signaled by the processor is configured to adjust a level of the coolant in at least one of the third reservoir or the fourth reservoir by the third coolant release valve or the fourth coolant release valve, respectively.

11. The system of claim 1, wherein the first reservoir and the second reservoir are configured to hold an overflow of the coolant from the first component cooling tank and the second component cooling tank, respectively.

12. The system of claim 1, wherein the first reservoir and the second reservoir are each the largest coolant reservoirs of the first component cooling tank and the second component cooling tank, respectively.

13. A method for controlling coolant levels in two or more component cooling tanks sharing a unified coolant distribution system, comprising:

receiving, at a processor of the unified coolant distribution system, temperature measurements of a coolant in a first reservoir and a second reservoir of the two or more component cooling tanks;

receiving, at the processor of the unified coolant distribution system, a coolant level measurement of the coolant in the first reservoir; and signaling, by the processor to a coolant level regulator component of each of the two or more component cooling tanks, a target coolant level update configured to equalize levels of the coolant in the first reservoir and the second reservoir to a target coolant level, wherein the target coolant level is determined based on the received coolant level measurement and a temperature average of the received temperature measurements of the coolant in the first reservoir and the second reservoir.

14. The method of claim 13, wherein the target coolant level update signaled by the processor is determined by converting the temperature average of the received temperature measurements to a density average of the coolant in the first reservoir and the second reservoir.

15. The method of claim 13, wherein signaling the target coolant level update includes signaling:

a first coolant level controller configured to control a first coolant release valve that regulates the release of coolant from the first reservoir; and a second coolant level controller configured to control a second coolant release valve that regulates the release of coolant from the first reservoir.

16. The method of claim 13, wherein signaling the target coolant level update includes directly activating at least one of:

a first coolant release valve that regulates the release of coolant from the first reservoir; or a second coolant release valve that regulates the release of coolant from the first reservoir.

* * * * *